United States Patent [19]

Egara et al.

[11] Patent Number: 4,882,715

[45] Date of Patent: Nov. 21, 1989

[54] SURFACE ACOUSTIC WAVE CONVOLVER WITH DIELECTRIC FILM OF HIGH NON-LINEAR EFFECT

[75] Inventors: Koichi Egara, Tokyo; Norihiro Mochizuki, Yokohama; Kenji Nakamura, Hadano; Kazuo Yoshinaga, Machida, all of Japan

[73] Assignee: Canon Kabushiki Kaisha, Tokyo, Japan

[21] Appl. No.: 167,254

[22] Filed: Mar. 11, 1988

[30] Foreign Application Priority Data

| | | | |
|---|---|---|---|
| Mar. 16, 1987 | [JP] | Japan | 62-60466 |
| Sep. 4, 1987 | [JP] | Japan | 62-220489 |

[51] Int. Cl.[4] .................... H04R 23/00; H01L 41/08

[52] U.S. Cl. .................... 367/140; 310/313 R; 310/313 B; 333/150; 333/151; 333/154; 333/196

[58] Field of Search .................... 367/140, 164; 333/150, 333/151, 152, 154, 193, 196; 310/313 R, 313 A, 313 B

[56] References Cited

U.S. PATENT DOCUMENTS

| | | | |
|---|---|---|---|
| 3,962,673 | 6/1976 | Desbois et al. | 333/193 |
| 4,041,536 | 8/1977 | Melcher et al. | 358/213.14 |
| 4,224,683 | 9/1980 | Adkins | 333/154 |
| 4,379,998 | 4/1983 | Shockley | 333/150 |
| 4,556,949 | 12/1985 | Solie | 333/195 |
| 4,745,378 | 5/1988 | Niitsuma et al. | 333/154 |
| 4,757,226 | 7/1988 | Mitsutsuka et al. | 333/152 |

*Primary Examiner*—Deborah L. Kyle
*Assistant Examiner*—Woodrow J. Eldred
*Attorney, Agent, or Firm*—Fitzpatrick, Cella, Harper & Scinto

[57] ABSTRACT

In a surface acoustic wave elastic convolver capable of showing sufficiently high convolution efficiency with a simple structure, the convolver comprises a piezo-electric substrate, plural input transducers formed on the substrate for respectively generating surface acoustic waves corresponding to input signals, an output transducer for obtaining a convolution signal of the input signals, from a surface acoustic wave generated by non-linear interaction, of the surface acoustic waves generated by those input transducers, and a dielectric film of a non-linear effect larger than that of the substrate, formed on the substrate in at least an area where the output transducer is formed.

8 Claims, 2 Drawing Sheets

SURFACE ACOUSTIC WAVE CONVOLVER WITH DIELECTRIC FILM OF HIGH NON-LINEAR EFFECT

BACKGROUND OF THE INVENTION

1. Field of the Invention

The present invention relates to a surface acoustic wave convolver for obtaining a convolution output utilizing non-linear mutual interaction of plural surface acoustic waves.

2. Related Background Art

The surface acoustic wave convolver is considered more and more important in recent years as a key device for a diffused spectrum communication. Also intensive research is being made for various applications as a real-time signal processing device.

FIG. 1 is a plan view showing an example of such conventional surface acoustic wave convolver, and FIG. 2 is a schematic cross-sectional view along a line A—A'. In these drawings there are shown a substrate 11 composed of a piezoelectric material such as Y-cut (in XYZ right handed coordinate system of crystal, cut along a plane normal to Y-axis) (Z-propagation) lithium niobate; inter-digital electrodes 14,15 formed on said piezoelectric substrate 11, for converting an electric signal into a surface acoustic wave signal; an output electrode 13 formed on said piezoelectric substrate 11, for obtaining a convolution output of two surface acoustic for obtaining a convolution output of two surface acoustic wave signals; and ground electrodes 16 formed on the piezoelectric substrate 11. These electrodes are composed of a conductive material such as aluminum, and generally formed by a photolithographic process.

For obtaining a convolution output with such surface acoustic wave convolver, two input signals with a carrier frequency $\omega$ are respectively entered to the inter-digital input electrodes 14, 15 for conversion into surface acoustic wave signals, which propagate in mutually opposite directions on the surface of the piezoelectic substrate 11, whereby a convolution signal with a carrier frequency $2\omega$ is obtained from the output electrode 13 utilizing the physical non-linear effect of the substrate.

Two surface acoustic waves:

$$F\left(t-\frac{x}{v}\right)e^{j(kx+\omega t)},\ G\left(t+\frac{x}{v}\right)e^{j(-kx+\omega t)}$$

generate a surface wave represented by a product:

$$F\left(t-\frac{x}{v}\right)\cdot G\left(t+\frac{x}{v}\right)e^{j2\omega t}$$

on the substrate, due to the non-linear effect of said substrate. This signal is integrated within the range of a uniform output electrode and is taken out therefrom as a signal:

$$S(t) = Ke^{j2\omega t}\int_{-\frac{l}{2}}^{\frac{l}{2}} F\left(t-\frac{x}{v}\right)\cdot G\left(t+\frac{x}{v}\right)dx \quad (1)$$

wherein l is the length of area of mutual interaction. The range of integration can be practically considered as $\pm\infty$ if the length of mutual interaction is larger than the wavelength of signal, and the equation (1) can be trnsformed, by taking $\tau=t-(x/v)$, as:

$$S(t) = -vKe^{j2\omega t}\int_{-\infty}^{\infty} F(\tau)G(2t-\tau)d\tau \quad (2)$$

so that said signal constitutes the convolution of two surface acoustic waves.

The mechanism of such convolution is detailedly described for example in "Application of surface acoustic wave", Shibayama, Television 30, 457 (1976).

Since the surface acoustic wave elastic convolver is based on the physical non-linearity of the substrate, said substrate is required to have a large electromechanical coupling constant $k^2$, indicating the ability of converting the electric energy into the elastic energy, and a large non-linear ability index $M=V_0/\sqrt{P_1P_2}$ wherein $V_0$ is the output voltage, and $P_1$ and $P_2$ are powers per unit beam width. On the other hand, it was already reported, for example by A. K. Ganguly and K. L. Davis in "Nonlinear-interactions in degenerate surface acoustic wave elastic convolvers" J. Appl. Phys. 51, 920 (1980), that such non-linear ability index M can be theoretically determined from the elastic, piezoelectric, dielectric constants etc. of the material constituting the substrate. Based on these facts, Y-cut (Z-propagation) lithium niobate has been employed as the most preferable substrate in the conventional surface elastic wave elastic convolvers, as described by Cho and Yamanouchi in "Determination of non-linear constants in $LiNbO_3$ single crystal and application to non-linear elastic wave devices. Research Report of Society for Electric Communication, US86-20, 53(1986).

However such non-linearity is limited in the material usable as the substrate, so that a sufficiently large convolution effect (convolution output for a constant input) could not be obtained in the above-explained conventional surface acoustic wave elastic convolvers.

SUMMARY OF THE INVENTION

The object of the present invention is to provide a surface acoustic wave elastic convolver capable of showing a sufficiently high convolution efficiency with a simple structure.

The above-mentioned object can be achieved, according to the present invention, by providing a conventional surface acoustic wave elastic convolver with a dielectric film of a non-linear effect larger than that of the piezoelectric substrate, at least in the area of the output electrode on said substrate. Thus, according to the present invention, a coating of a dielectric material of a high non-linearity on the substrate enhances the interaction between the surface acoustic wave and the medium, thereby improving the convolution efficiency.

DETAILED DESCRIPTION OF THE PREFERRED EMBODIMENTS

Now the present invention will be clarified in detail by embodiments thereof shown in the attached drawings.

Figure 1:
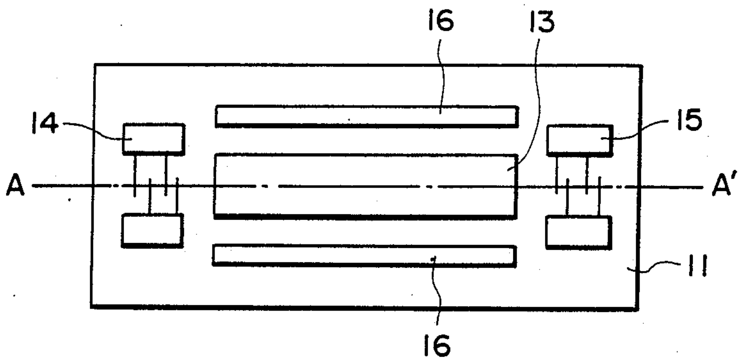
FIG. 1 PRIOR ART
FIGS. 1 and 2 are respectively a plan view and a schematic cross-sectional view of a conventional surface acoustic wave elastic convolver.
Figure 2:
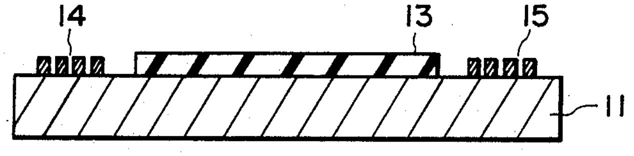
FIG. 2 PRIOR ART
Figure 3:
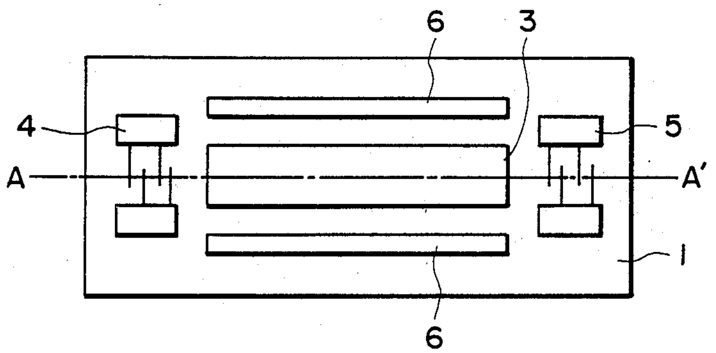
FIGS. 3 and 4 are respectively a plan view and a schematic cross-sectional view of an embodiment of the surface acoustic wave elastic convolver of the present invention.
Figure 4:
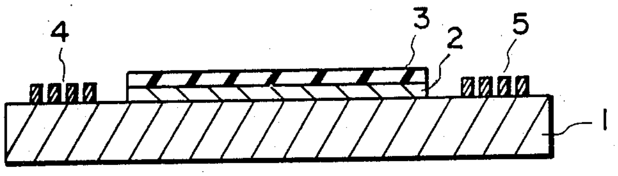

FIG. 3 is a plan view of a first embodiment of the surface acoustic wave elastic convolver of the present invention, and FIG. 4 is a schematic cross-sectional view along a line A—A' in FIG. 3, wherein shown are a piezoelectric substrate 1 composed of Y-cut (Z-propagation) lithium niobate; interdigital input electrodes 4, 5, formed on said piezoelectric substrate, for generating surface acoustic waves according to input signals and thus constituting input transducers; a dielectric film 2 of non-linearity larger than that of said substrate, formed on the piezoelectric substrate in an area not having said interdigital electrodes 4, 5; an output electrode 6 formed on said dielectric film 2, for obtaining the convolution output of two surface acoustic wave signals, thus constituting an output transducer; and ground electrodes 6 formed on the dielectric film 2. These electrodes are composed of a conductive material such as aluminum, and are patterned by a photolithographic technology or with an evaporation mask.

In the present embodiment, said dielectric film 2 is formed only in the area of the output electrode 3, so that the oscillation and propagation of the surface acoustic wave is principally done in the piezoelectric substrate 1 composed of Y-cut (Z-propagation) lithium niobate and the energy of the surface acoustic wave scarcely decreases from that in the conventional device even if the material of the dielectric film 2 has a small electromechanical coupling constant $k^2$.

Said dielectric film 2 can be preferable composed of MNA (2-methyl-4-nitroaniline) represented by the following formula:

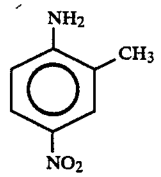

which shows a large second-order non-linearity such as a polarization caused by an electric field, based on a large polarization of the π-electron conjugation system having $NH_2$ radical and $NO_2$ radical and an asymmetric structure caused by the presence of $CH_3$ radical. For example B. F. Levine reported, in "An organic crystal with an exceptionally large optical second harmonic coefficient: 2-methyl-4-nitroaniline", J. Appl. Phys. 50, 2523 (1979), that MNA shows a nonlinear optical coefficient ($d_{11}$) about 40 times larger than that ($d_{31}$) of lithium niobate.

For effecting convolution in the above-explained embodiment, two signals of a carrier frequency ω are respectively supplied to the interdigital input electrodes 4, 5 to generate surface acoustic wave signals, which propagate in mutually opposite directions on the surface of the piezoelectric substrate 1 and mutually overlap in the area of the output electrode 3. Thus a convolution signal of a carrier frequency 2ω is obtained from the output electrode 3, by these surface acoustic waves and the non-linear interaction between the substrate 1 and the dielectric film 2. As the dielectric film 2 has a non-linearity larger than that of the piezoelectric substrate 1, the convolution output obtainable from the output electrode 3 is larger than that from the conventional convolver utilizing the substrate only.

In addition to MNA mentioned above, there may be conveniently employed, as the material for the dielectric film, other organic materials such as:

ROM (3-methyl-4-nitropyridine-1-oxide) represented by the following formula:

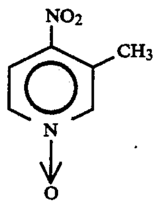

m-NA(m-nitroaniline) represented by the following formula:

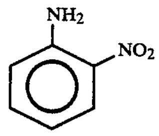

PDA-NTDA (polydiacetylene-NTDA) which is a diacetylene polymer obtained from a monomer of the following formula:

R—C≡C—C≡C—R'

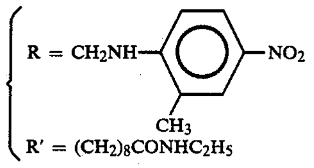

R' = $(CH_2)_8CONHC_2H_5$

PDA-MNADA (polydiacetylene-MNADA) obtained from a monomer of the following formula:

R—C≡C—C≡C—R'

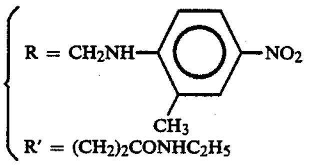

R' = $(CH_2)_2CONHC_2H_5$

Also in the present invention there may be employed a dielectric film containing a principal component composed of a compound in which an electron donating radical and an electron attracting radical or an electron attracting radical are connected either directly or through an electron conjugation system (hereinafter generally called compound A), as proposed in the 34th Convention of the Society for Applied Physics of Japan, Preprints 30a-m-5 and in the 36th Convention of the Society of Polymer Chemistry of Japan, Preprint 2-16-01 (1987).

In said compound A, the electron donating radical can be amino, alkyl, alkoxy, alkylamino, hydroxyalkylamino, dialkylamino, hydroxyalkyl-alkyl-amino, dihydroxyalkylamino, mercapto, hydroxy radical or a proton radical; and the electron attracting radical can be nitro, cyano, trifluoromethyl, carbonyl, sulfonyl, carboxyl, carboxyester radical or halogen radical.

Examples of the compound A include mono-substituted benzenes, mono-substituted bipyridines, di-substituted bipyridines, tri-substituted bipyridines, tetra-substituted bipyridines, tri-substituted benzenes, tetra-substituted benzenes, penta-substituted benzenes, hexa-substituted benzenes, mono-substituted biphenyls, di-substituted biphenyls, tri-substituted biphenyls, tetra-substituted biphenyls, mono-substituted naphthalenes, di-substituted naphthalenes, tri-substituted naphthalenes, tetra-substituted naphthalenes, mono-substituted pyridines, di-substituted pyridines, tri-substituted pyridines, tetra-substituted pyridines, mono-substituted pyrazines, di-substituted pyrazines, tri-substituted pyrazines, tetra-substituted pyrazines, mono-substituted pyrimidines, di-substituted pyrimidines, tri-substituted pyrimidines, tetra-substituted pyrimidines, mono-substituted azulenes, di-substituted azulenes, tri-substituted azulenes, tetra-substituted azulenes, mono-substituted pyrroles, di-substituted pyrroles, tri-substituted pyrroles, tetra-substituted pyrroles, mono-substituted thiophenes, di-substituted thiophenes, tri-substituted thiophenes, tetra-substituted thiophenes, mono-substituted furans, di-substituted furans, tri-substituted furans, tetra-substituted furans, mono-substituted pyrylium salts, di-substituted pyrylium salts, tri-substituted pyrylium salts, tetra-substituted pyrylium salts, mono-substituted quinolines, di-substituted quinolines, tri-substituted quinolines, tetra-substituted quinolines, mono-substituted pyridazines, di-substituted pyridazines, tri-substituted pyridazines, tetra-substituted pyridazines, mono-substituted triazines, di-substituted triazines, tri-substituted triazines, tetra-substituted triazines, mono-substituted anthracenes, di-substituted anthrancenes, tri-substituted anthracenes, tetra-substituted anthracenes (all of these are derivatives), etc.

More specific examples include 3-nitro-4-hydroxy-3-sodium carboxyazobenzene; 4-chloro-phenyl-quinazoline; urea; aminoacetonitrile; aminoacetophenone, aminoacrydine; aminoadipic acid; aminoanthracene; aminobiphenyl; 2-amino-5-bromobenzoic acid; 1-amino-4-bromo-2-methylanthraquinone; 1-amino-4-bromonaphthalene; 2-amino-5-bromopyridine; aminobutyric acid; aminochlorobenzene sulfonic acid; 2-amino-4-chlorobenzoic acid; 2-amino-5-chlorobenzoic acid; 3-amino-4-chlorobenzoic acid; 4-amino-2-chlorobenzoic acid, 5-amino-2-chlorobenzoic acid; 2-amino-5-chlorobenzonitrile; 2-amino-5-chlorobenzophenone; amino-chlorobenzotrifluoride; 3-amino-6-chloromethyl-2-pyrazinecarbonitrile-4-oxide; 2-amino-4-chloro-6-methylpyridine; 1-amino-4-chloronaphthalene; 2-amino-3-chloro-1,4-naphthoquinone; 2-amino-4-chloro-5-nitrophenol; 2-amino-4-chloro-5-nitrotoluene; 2-amino-4-chloro-4-phenol; N-(2-amino-4-chlorophenyl)anthranic acid; 2-amino-5-chloro purine; 2-amino-5-chloropyridine; 3-amino-2-chloropyridine; 5-amino-2-chloropyridine; aminochrycene; 2-amino-p-cresol; 3-amino-o-cresol; 4-amino-o-cresol; 4-amino-m-cresol; 6-amino-m-cresol; 3-aminochrotonitrile; 6-amino-3-cyano-2,4-dimethylpyridine; 5-amino-6-cyano-2-pyrazinyl acetate; 4-[N(2-methyl-3-cyano-5-pyrazinyl-methyl)amino]benzoic acid; 5,5-dinitroaniline; 4(2,4-dinitroanilino)phenol; 2,4-dinitroanisole; 2,4-dinitro-benzaldehyde; 2,6-dinitrobenzaldehyde; 3,5-dinitrobenzamide; 1,2-dinitrobenzene; 1,3-dinitrobenzene; 1,4-dinitrobenzene; 3,4-dinitrobenzoic acid; 3-5-dinitrobenzoic acid; 3,5-dinitrobenzonitrile; 2,6-dinitro-p-cresol; 4-6-dinitro-o-cresol; 2-4-dinitrodiphenylamine, dinitrodurene; 2,4-dinitro-N-ethylaniline; 2-7-dinitrofluorene; 2,4-dinitrofluorobenzene; 1,3-dinitronaphthalene; 1,5-dinitronaphthalene; 1,8-dinitronaphthalene; 2,4-dinitrophenol; 2-5-dinitrophenol; 2,4-dinitrophenylhydrazine; 3,5-dinitrosalicylic acid; 2,3-dinitrotoluene; 2-4-dinitrotoluene; 2,6-dinitrotoluene; 3,4-dinitrotoluene; 9-nitroanthracene; 4-nitroanthranic acid; 2-amino-5-trifluoromethyl-1,3,4-thiazole; 7-amino-4-(trifluoromethyl)coumarine; 9-cyanoanthracene; 3-cyano-4,6-dimethyl-2-hydroxypyridine; 5-cyanoindole; 2-cyano-6-methoxybenzothiozole; 9-cyanophenanthrene; cyanulic chloride; 1,2-diaminoanthraquinone; 3,4-diaminobenzoic acid; 3,5-diaminobenzoic acid; 3,4-diaminobenzophenone; 2,4-diamino-6-(hydroxymethyl)pteridine; 2,6-diamino-4-nitrotoluene; 2,3-dicyanohydroquinone; 2,4-dinitroaniline; 2,6-dinitroaniline; 2-amino-5-iodobenzoic acid; aminomethane sulfonic acid; aminomethoxybenzoic acid; 2-amino-4-methoxybenzo-thiazole; 2-amino-6-methoxybenzothiazole; 5-amino-2-methoxyphenol; 5-amino-2-methoxypyridine; 2-amino-3-methylbenzoic acid; 2-amino-5-methylbenzoic acid; 2-amino-6-methylbenzoic acid; 3-amino-4-methylbenzoic acid; 4-amino-3-methylbenzophenone; 2-amino-4-methyl-benzophenone; 7-amino-4-methylcoumarine; 3-amino-5-methyliso-oxazole; and 7-amino-4-methyl-1,8-naphthylidine-2-ol.

The second-order micro non-linear constant generally determined by the molecular structure is given by the following equation, as explained by J. F. Ward in "Reviews of Modern Physics, 37.1(1965)":

$$\beta = -\frac{e^3}{2\hbar^2} \cdot (r_{i(gn)})^2 \Delta r_{i(n)} \frac{\omega^2_{(ng)}}{(\omega^2_{(ng)} - \omega^2)(\omega^2_{(ng)} - 4\omega^2)}$$

wherein:

$\omega_{(ng)}$: energy difference between ground and excited states;

$\hbar$: Planck constant $r_{i(gn)}$: component of dipole matrix between ground excited states;

e: electron charge $\Delta r_{i(n)} = r_{i(mm)} \rightarrow r_{i(gg)}$.

Consequently the presence of a large dipole moment is effective in the non-linear material.

In consideration of the foregoing, a compound A having an electron donating radical selected from amino, alkyl, alkoxy, alkylamino, hydroxyalkyl-amino, dialkylamino, hydroxyalkyl-alkylamino, dihydroxyalkylamino, mercapto and hydroxyl radical and proton radical, and an electron attracting radical selected from nitro, cyano, halogeno, trifluoromethyl, carbonyl, sulfonyl, carboxyl and carboxyester radical is preferred due to a large intramolecular dipole moment caused by the interaction of said electron donating radical and the electron attracting radical. However most of these compounds have a center of symmetry in the crystal structure so that the second-order non-linearity cannot be obtained.

On the other hand, according to the present invention, said compound A is combined with a polymer mutually soluble therewith inconstituting the dielectric film, and an orienting treatment is applied in a direction to eliminate such center of symmetry and to maximize the non-linear effect, whereby an excellent non-linear effect can be obtained.

Said polymer is adapted to be mutually soluble with the compound A of a large dipole moment and to eliminate the center of symmetry by interaction, and is for example composed of polyoxyalkylene preferably of the following structure:

$$-(-R-O-)_n- \quad (2)$$

wherein R is an alkylene radical containing 1 to 6 carbon atoms, and n is an integer from 100 to 200,000.

An alkylene radical containing 1 to 6 carbon atoms is preferable as the radical R because a number of carbon atoms equal or larger than 7 reduces the mutual solubility with the compound A, so that a film with satisfactory physical properties cannot be obtained.

Among such polyoxyalkylenes particularly preferred are those in which R contains 2 to 4 carbon atoms. Such mutual solubility is presumable attributable to a fact that said polyoxyalkylene has a spiral structure in the crystalline state.

The orienting process applicable to the dielectric film containing the above-mentioned two components includes application of an electric field or a magnetic field, and stretching.

A particularly effective orienting with electric field consists of heating the dielectric film to a temperature at least equal to the melting point of said film, applying an electric field in a direction same as that of the electric field of the surface acoustic wave in the melted state, and cooling the film while such electric field is applied. The application of the electric field can be achieved for example by supplying a DC current to electrodes positioned above and below said dielectric film, or by a corona discharge.

Such orienting process aligns the dipole moment of the compound A in the direction of electric field, thereby arranging the largest micro non-linear constant perpendicular to plane of the dielectric film and allowing to utilizing the non-linear effect in the most effective manner.

Said orienting can also be achieved by a method of heating the dielectric film to a temperature equal to or higher than the melting point thereof and cooling said film to a temperature below said melting point during application of a magnetic field, or by a mono or bi-axial stretching.

The formation of the dielectric film prior to the orienting process is not limited, but can be achieved, for example, by uniformly dissolving the compound A in solution of a polymer mutually soluble therewith and casting and drying thus obtained homogeneous solution.

In this procedure, heating to 40°-120° C. allows to obtain a satisfactory dielectric film without separation of the compound A and the polymer. Contrary to a bulk material, the dielectric film can be prepared easily with a desired thickness.

In the following the present invention will be clarified further by preferred examples.

EXAMPLE 1

1.03 gr. (23 mmol) of polyoxyethylene of a molecular weight of 20,000 and 0.44 gr. (3 mmol) of p-nitroaniline were added in 10 ml. of benzene and dissolved for 5 hours. The obtained solution was spin coated on an area of a $YZ-LiNbO_3$ single crystal substrate outside the interdigital input electrodes and dried at 60°-80° C. to obtain a uniform dielectric film.

Then the interdigital input electrodes and the output electrode were formed by vacuum evaporation and an ordinary photolithographic process. Then an aluminum layer was evaporated on the opposite face of said substrate. Subsequently the device was heated to 80° C., and cooled to the room temperature under the application of an electric field at least equal to 100 V/cm across the upper and lower electrodes to obtain a surface acoustic wave elastic convolver of the present invention.

EXAMPLE 2

2.12 gr. (48 mmol) of polyoxyethylene of a molecular weight of 5,000,000 and 1.57 gr. (11 mmol) of p-nitroaniline were added to 100 ml. of acetonitrile and dissolved therein for 5 hours. The obtained solution was spin coated on an area of a $YZ-LiNbO_3$ single crystal substrate other than the interdigital electrodes, and dried at 60°-80° C. to obtain a uniform dielectric film.

Then the interdigital input electrodes and the output electrode were formed by evaporation utilizing an ordinary photolithographic process. Then an orienting process is conducted by a corona discharge with a voltage of 5-6 kV.

Figure 5:
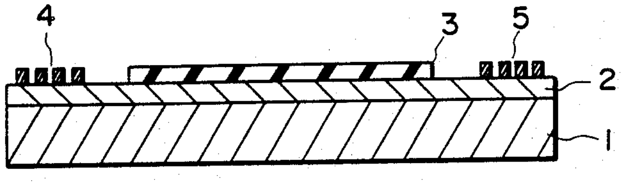
FIGS. 5 and 6 are schematic cross-sectional views showing other embodiments of the present invention.
Figure 6:
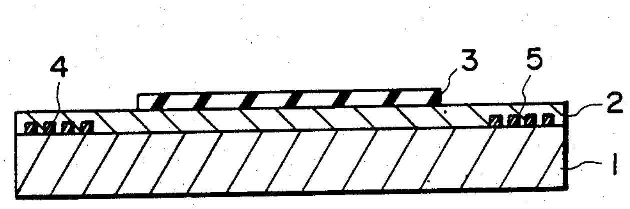

FIGS. 5 and 6 illustrate other embodiments of the surface acoustic wave elastic convolver of the present invention, wherein same components as those in FIG. 4 are represented by same numbers and will not be explained further.

In a second embodiment shown in FIG. 5, the dielectric film 2 is formed over the entire area of the substrate 1, and the interdigital input electrodes 4, 5, output electrode 3 and unrepresented ground electrode are formed thereon.

In a third embodiment shown in FIG. 6, the dielectric film 2 is formed uniformly over the entire area of the substrate 1 which already has the interdigital input electrodes 4, 5, and the output electrode 3 and the unrepresented ground electrodes are subsequently formed thereon.

The above-explained second and third embodiments can also provide same effects as those in the foregoing first embodiment. In addition, in said second and third embodiments, the speed of the surface acoustic wave and the electromechanical coupling constant $k^2$ can be varied by the formation of the dielectric film, so that an optimum structure can be selected according to the constants of the materials constituting the substrate and the dielectric film.

The present invention is not limited to the foregoing embodiments but is subject to various modifications. For the Y-cut (Z-propagation) lithium niobate employed in the foregoing embodiments may be replaced by a substrate of another cut or of another propagating direction, or by another piezoelectric substrate for the surface acoustic wave device.

Also in the foregoing embodiments, the interdigital input electrode 4 or 5 is composed of an ordinary single electrode, but it may also be composed of a double electrode in order to reduce the influence of interelectrode reflection of the surface acoustic wave. Furthermore the present invention is applicable to a device in which the beam width of the surface acoustic wave is reduced by means of a horn wave guide or a compressor utilizing a multistrip coupler.

Forthermore there may be adopted a two-track structure in order to suppress self convolution. Furthermore the present invention is applicable to a structure in which the convolution electrode is divided.

The present invention includes such variations within the scope and spirit of the appended claims.

What is claimed is:

1. A surface acoustic wave elastic convolver comprising:

a piezoelectric substrate;

plural input transducers formed on said substrate, for respectively generating surface acoustic waves corresponding to input signals;

an output transducer for obtaining a convolution signal of said input signals, from a surface acoustic wave generated by non-linear interaction, of the surface acoustic waves thus generated by said input transducers; and a dielectric film of a non-linear effect larger than that of said substrate, formed on said substrate in at least the area wherein said output transducer is formed.

2. A surface acoustic wave elastic convolver according to claim 1, wherein said dielectric film is composed of a material selected from 2-methyl-4-nitroaniline, 3-methylnitropyridine-1-oxide, m-nitro-aniline and diacetylene polymer.

3. A surface acoustic wave elastic convolver according to claim 1, wherein said dielectric film is substantially composed of a compound in which an electron donating radical and an electron attracting radical or an electron donating radical are connected either directly or through an electron conjugating system, and a polymer mutually soluble with said compound, and said film is subjected to an orienting treatment.

4. A surface acoustic wave elastic convolver according to claim 3, wherein said electron donating radical is amino, alkyl, alkoxy, alkylamino, hydroxyalkylamino, dialkylamino, hydroxyalkyl-alkylamino, dihydroxyalkylamino or mercapto radical.

5. A surface acoustic wave elastic convolver according to claim 3, wherein said electron attracting radical is a nitro, cyano, halogeno, trifluoromethyl or carbonyl radical.

6. A surface acoustic wave elastic convolver according to claim 3, wherein said polymer is polyoxyalkylene.

7. A surface acoustic wave elastic convolver according to claim 1, wherein said substrate is composed of lithium niobate.

8. A surface acoustic wave elastic convolver according to claim 1, wherein said input transducers are composed of interdigital electrodes.

* * * * *

UNITED STATES PATENT AND TRADEMARK OFFICE

CERTIFICATE OF CORRECTION

PATENT NO. : 4,882,715

DATED : November 21, 1989

INVENTOR(S) : KOICHI EGARA, ET AL.

It is certified that error appears in the above-identified patent and that said Letters Patent is hereby corrected as shown below:

COLUMN 1

Lines 30-31, "for obtaining a convolution output of two surface acoustic" should be deleted.

COLUMN 2

Line 36, "devices." should read --devices,"--.

COLUMN 3

Line 36, "preferable" should read --preferably--.

COLUMN 5

Line 40, "anthrancenes" should read --anthracenes--.

COLUMN 7

Line 22, "presumable" should read --presumably--.

UNITED STATES PATENT AND TRADEMARK OFFICE

CERTIFICATE OF CORRECTION

PATENT NO. : 4,882,715

DATED : November 21, 1989

INVENTOR(S) : KOICHI EGARA, ET AL.

It is certified that error appears in the above-identified patent and that said Letters Patent is hereby corrected as shown below:

COLUMN 9

Line 3, "Forthermore" should read --Furthermore--.

Signed and Sealed this

Twenty-eighth Day of July, 1992

Attest:

DOUGLAS B. COMER

Attesting Officer

*Acting Commissioner of Patents and Trademarks*